United States Patent [19]

Kelsey et al.

[11] Patent Number: 5,452,227

[45] Date of Patent: Sep. 19, 1995

[54] METHOD AND APPARATUS FOR CONVERTING A PROGRAMMABLE LOGIC DEVICE DESIGNED INTO A SELECTABLE TARGET GATE ARRAY DESIGN

[75] Inventors: Randy J. Kelsey, Hampstead, Md.; Larry D. Aschliman, Jacobus, Pa.

[73] Assignee: Westinghouse Elec. Corp., Baltimore, Md.

[21] Appl. No.: 790,920

[22] Filed: Nov. 13, 1991

[51] Int. Cl.$^6$ ............................................. G06F 17/50
[52] U.S. Cl. .................................... 364/489; 364/488; 364/578
[58] Field of Search ............... 364/488, 489, 490, 491, 364/578; 395/500; 371/25

[56] References Cited

U.S. PATENT DOCUMENTS

| | | | |
|---|---|---|---|
| 4,571,724 | 2/1986 | Belmondo et al. | 371/25 |
| 4,922,432 | 5/1990 | Kobayashi et al. | 364/490 |
| 4,937,770 | 6/1990 | Samuels et al. | 364/578 |
| 4,942,536 | 7/1990 | Watanabe et al. | 364/490 |
| 4,967,367 | 10/1990 | Piednoir | 364/489 |
| 5,005,136 | 4/1991 | Van Berkel et al. | 364/490 |
| 5,067,091 | 11/1991 | Nakazawa | 364/490 |
| 5,084,824 | 1/1992 | Lam et al. | 364/490 |
| 5,258,932 | 11/1993 | Matsuzaki | 364/578 |
| 5,263,149 | 11/1993 | Winlow | 395/500 |
| 5,276,855 | 1/1994 | Kitahara | 395/500 |
| 5,339,262 | 8/1994 | Rostoker et al. | 364/578 |

OTHER PUBLICATIONS

"A Behavioural Test Method for Microprocessors and Complex Circuits" by C. Bellon et al., European Conference on Electronic Design Automation (EDA84), 26–30 Mar. 1984, pp. 79–82.

Primary Examiner—Vincent N. Trans

[57] ABSTRACT

The present invention is a translation system that translates a definition of a prototyped programmable device defined in a programmable device specification into a generic behavioral model of the device and into lists of logic blocks and connections for implementing the device as a non-programmable device in an application specific target technology. The lists and behavioral models are used to create command files that drive logic synthesis and network connection list processing operations to generate a generic list of logic and network connections. The generic list and commands are used to create device test vectors for testing the behavior of the model and the target device design. The target technology lists and command files are processed to reduce redundant logic and are mapped into logic blocks and connection lists in the target technology. The operation of the target technology design is simulated using the target logic blocks and connections and the test vectors. The behavioral model is compiled to allow behavioral simulation of the operation of the device using the same test vectors. When the simulation of the target technology and the behavioral model produce identical outputs, the target non-programmable design exactly matches the operation of the prototype programmable device and the target technology design can then be used in mass production of the logic device.

9 Claims, 5 Drawing Sheets

METHOD AND APPARATUS FOR CONVERTING A PROGRAMMABLE LOGIC DEVICE DESIGNED INTO A SELECTABLE TARGET GATE ARRAY DESIGN

REFERENCE TO MICROFICHE APPENDIX

A microfiche appendix, including appendices A–D is included herewith and incorporated by reference herein and includes 1 fiche and 46 frames.

BACKGROUND OF THE INVENTION

1. Field of the Invention

The present invention is directed to a process and apparatus for automatically converting a design implemented with a programmable device into a design of a non-programmable device in a selected, specific, desired gate array technology and, more particularly, to a method and apparatus that automatically creates a behavioral model of the programmable device and a design of the device in a target technology, simulates both the model and the design which are then compared, thereby insuring that the behavior of the programmable logic, in which the device was designed, is the same as the behavior of the non-programmable logic implemented in the target gate array technology.

2. Description of the Related Art

Conventionally, logic devices are designed and tested (prototyped) using programmable logic or programmable gate array devices which are specifically designed to assist in the design of the logic device desired. Programmable devices are used for the prototypes and final designs because the devices can be easily reprogrammed during the design process whenever a mistake in the design of the device is discovered. Once the design using the programmable logic is completed and tested, if the manufacturer desires to produce the logic device in large quantities at a reduced cost, the design in the programmable logic must be converted into a design in the non-programmable target technology. This conversion is generally performed by engineers that specialize in the target technology and not the designers of the original device. The conventional method for converting from a programmable device to a specific gate array consists of manually entering a design into a computer aided engineering tool which is compatible or supports the target technology foundry and manually converting simulation results from the computer aided engineering tool in which the programmable device was designed into simulation results in the tool of the target foundry to provide a baseline to check the converted design. If after manual entry, if it is discovered that models for one or more of the parts within a programmable device design do not exist within the target foundry library, they must be created using target foundry parts. The only verification of a correct translation into the target gate array technology is the simulation output and any fault coverage less than 100 percent allows for undetected errors. That is, if the test vectors created for the original device do not test newly created models then the untested portion may not perform the function of the original design.

SUMMARY OF THE INVENTION

It is an object of the present invention to automate translation of programmable device designs into non-programmable gate array device designs that is, into an application specific integrated circuit design.

It is another object of the present invention to provide a system that will allow the device designers to easily convert the programmable device into an application specific device.

It is also an object of the present invention to allow any programmable device to be translated into a design in any target technology foundry.

It is a further object of the present invention to allow merging of several devices into a single gate array device.

It is another object of the present invention to allow confirmation of the behavior of the gate array device.

It is a still further object of the present invention to increase the speed of design conversion.

It is still another object of the present invention to allow arbitrary selection of a target foundry no matter what technology is used at the prototyping stage.

The above objects can be attained by a system that translates a definition of a prototyped programmable device into a generic behavioral model of the device and into lists of logic blocks and connections in the target technology. The lists and behavioral models are used to create logic creation and connection command files that drive logic synthesis and network connection list processing operations which generate a generic list of generic logic and network connections of the logic of the programmable device. The generic list and commands are used to create device test vectors for testing the behavior of the device. The target technology lists and command files are also processed to reduce redundant logic and are mapped into logic blocks and connection lists in the target technology which is the design in the target technology. The operation of the target technology design is simulated using the test vectors. The behavioral model is compiled to allow behavioral simulation of the operation of the device using the test vectors. When the simulation of the target technology and the behavioral model produce identical outputs, the target design functionally matches the operation of the prototype device and the target technology design can then be used in mass production of the device.

These together with other objects and advantages which will be subsequently apparent, reside in the details of construction and operation as more fully hereinafter described and claimed, reference being had to the accompanying drawings forming a part hereof, wherein like numerals refer to like parts throughout.

DESCRIPTION OF THE PREFERRED EMBODIMENTS

The present invention is a process and apparatus in which a design implemented with a programmable device, such as a Xilinx XC3000 logic cell array programmable device available from Xilinx of San Jose, Calif., is automatically converted into a gate array device for an application specific integrated circuit (ASIC), such as the 2.0 Micron gate array family from Lasarray Corporation of Irvine, Calif. The process takes the file necessary to program the programmable device and converts it into a network list (netlist), which is a list of parts and connections between those parts, that is used to fabricate new gate array devices.

Figure 1:
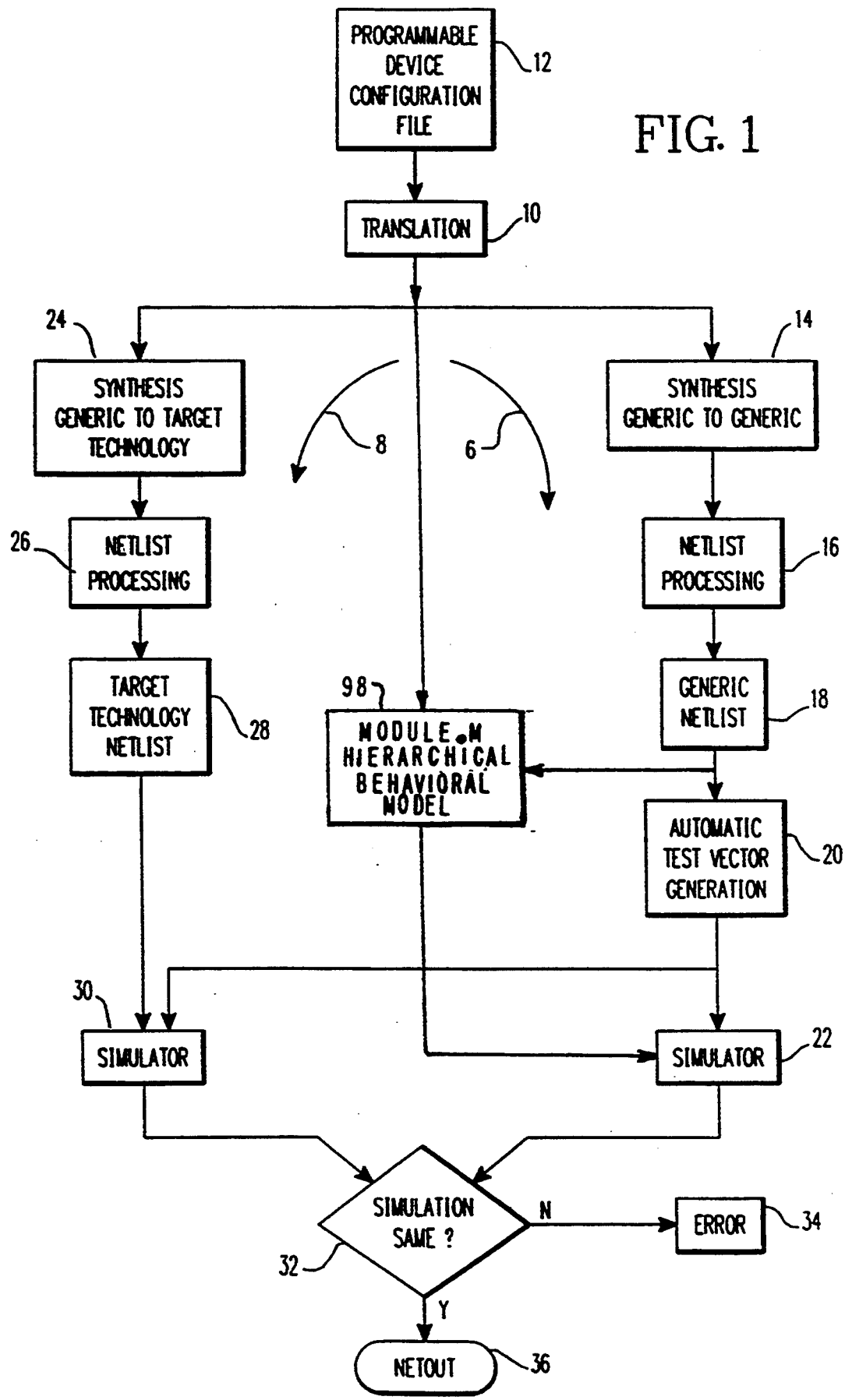
FIG. 1 is a block diagram of the operations performed in accordance with the present invention.

The process, as shown in the functional block diagram of FIG. 1, in general, begins by translating 10 the information in a programmable device configuration file 12 into a language that can be understood by conventional Computer Aided Engineering (CAE) tool. This translation 10 extracts the required information from the configuration file 12 and translates it into behavioral models for input to various CAE tools. From FIG. 1 it can be seen that two separate paths 6 and 8 are taken to reach the final goal, a netlist in the target technology. The two path approach is used to reduce the overall effort of the design conversion while at the same time increasing the reliability and probability of first run success. The path 6 to the right uses the timing parameters of the original design and, using a conventional logic synthesis tool 14 and netlist processing 16 converts the behavioral models into a component based schematic 18 using a generic library of parts, where the term schematic here refers to a representation of a design and not necessarily a graphical logic diagram. This generic schematic representation 18 is used as the database that an automatic test vector generation (ATG) step 20 uses to generate a set of test vectors for later use. This set of test vectors along with a hierarchical behavioral model 98 is the information from which a conventional simulation step 22 generates its results. These results are saved for later comparison to the left path 8 results. The left path 8 takes the behavioral models and converts 24 them using a command generation program and conventional netlist processing 26, into a component based schematic representation 28 based on the target technology library. This schematic 28 and the set of previously generated test vectors are used by a conventional simulation step 30 to simulate operation of the target device in the target technology. The results are compared 32 with the saved results of step 22 to provide proof of correct target technology response to inputs. If the results do not match an error is indicated.

During translation 10 the data from the configuration file 12 has to be divided into the behavioral modules of the logic and the connections between the logic in order to be processed individually and to maintain the original timing parameters for behavioral simulation. A logic behavioral model is essentially a model of the function performed by the logic being modeled and the specification of the time delay between the inputs and the outputs along with a specification of the time delay of the input connections with respect to the output of the model to which they are connected. Once the behavioral models have been generated they are individually synthesized 14 using several optimization algorithms that do some logic reduction in an effort to reduce the number of components processed by the test vector generation 20. The synthesized modules must now be merged together to form a single design 18. Netlist processing 16 combines nets of the same name into a single net 18. Various output formats of the netlist processing 18 are used for test vector generation 20 and the creation of the hierarchical behavioral model 98.

The merged netlist is now ready to have test vectors generated 20 for use in simulation and verification. The set of test vectors that are generated will be used to verify the functionality of the target technology netlist once it is generated.

The newly generated set of vectors and the hierarchical behavioral model 98 are the input files to the simulation 22. The behavioral model contains the original timing parameters that are used as the baseline to verify the test vector set. The simulator outputs the results of the simulation using the test vector set as the force file. The simulation file is automatically checked for any errors within the simulator using expected results from the automatic test vector generation and then stored for later reference. An errorless simulation file verifies that the set of test vectors, that were generated by ATG 20, can be used as the vector set to show functional compatibility with the target technology.

With the general description of the right path 6 complete, we describe the general operation of the left path 8. The behavioral models that were generated from the translation 10 are once again used as the input to a synthesis tool with one exception, a target technology is chosen. The target technology description includes a directory that contains all the information necessary to convert the behavioral models into a netlist in the chosen technology. The creation of the target technology database within a commercially available tool can be easily accomplished by anyone skilled in the art of using logic synthesis and reduction tools. The synthesis maps the behavioral models into a netlist (an interconnection list description of a gate array) containing the models with the parameters of the destination technology.

Figure 3:
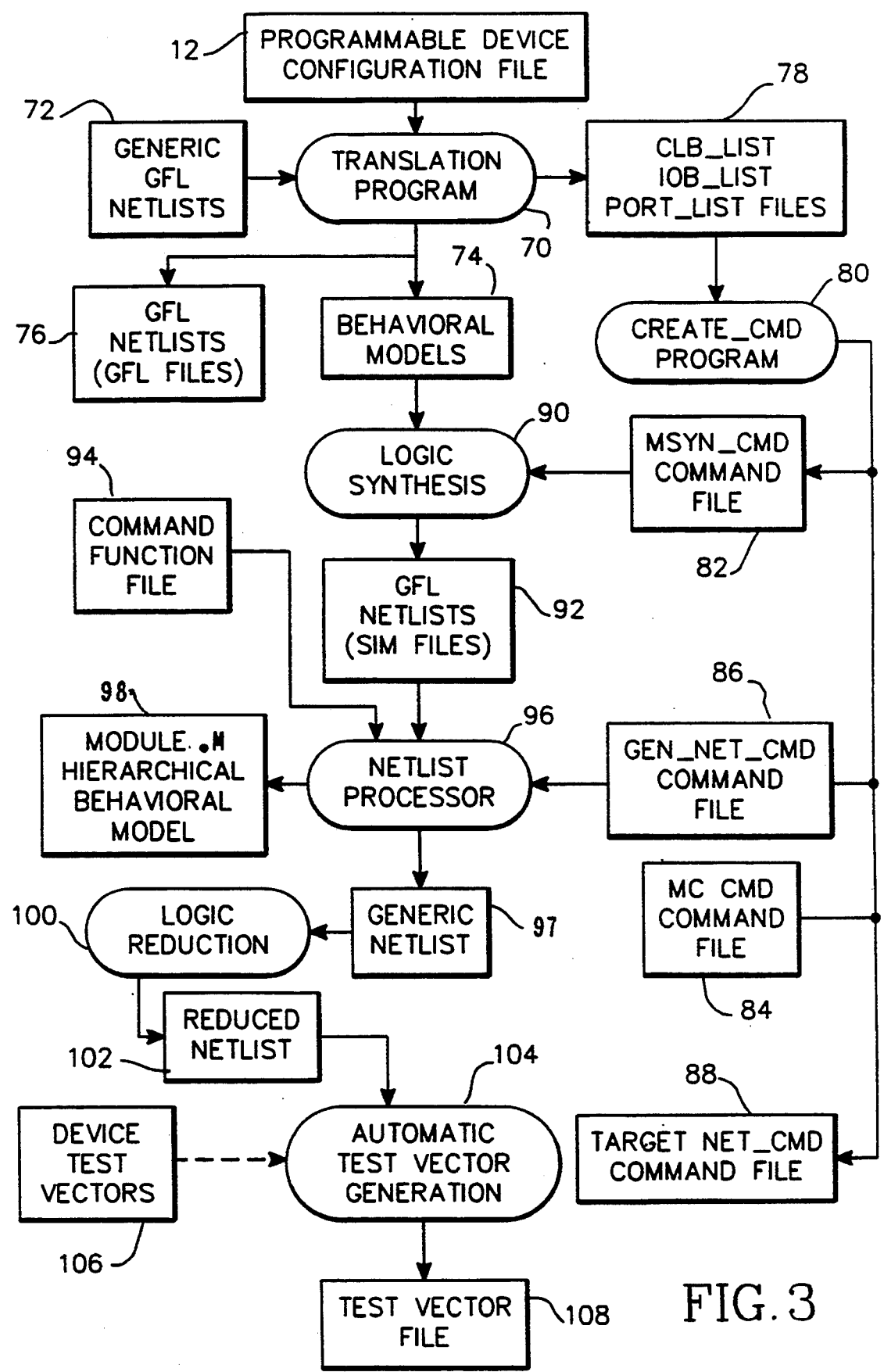
FIGS. 3–5 illustrate the processes of the present invention and the files used and produced by the present invention in detail.
Figure 4:
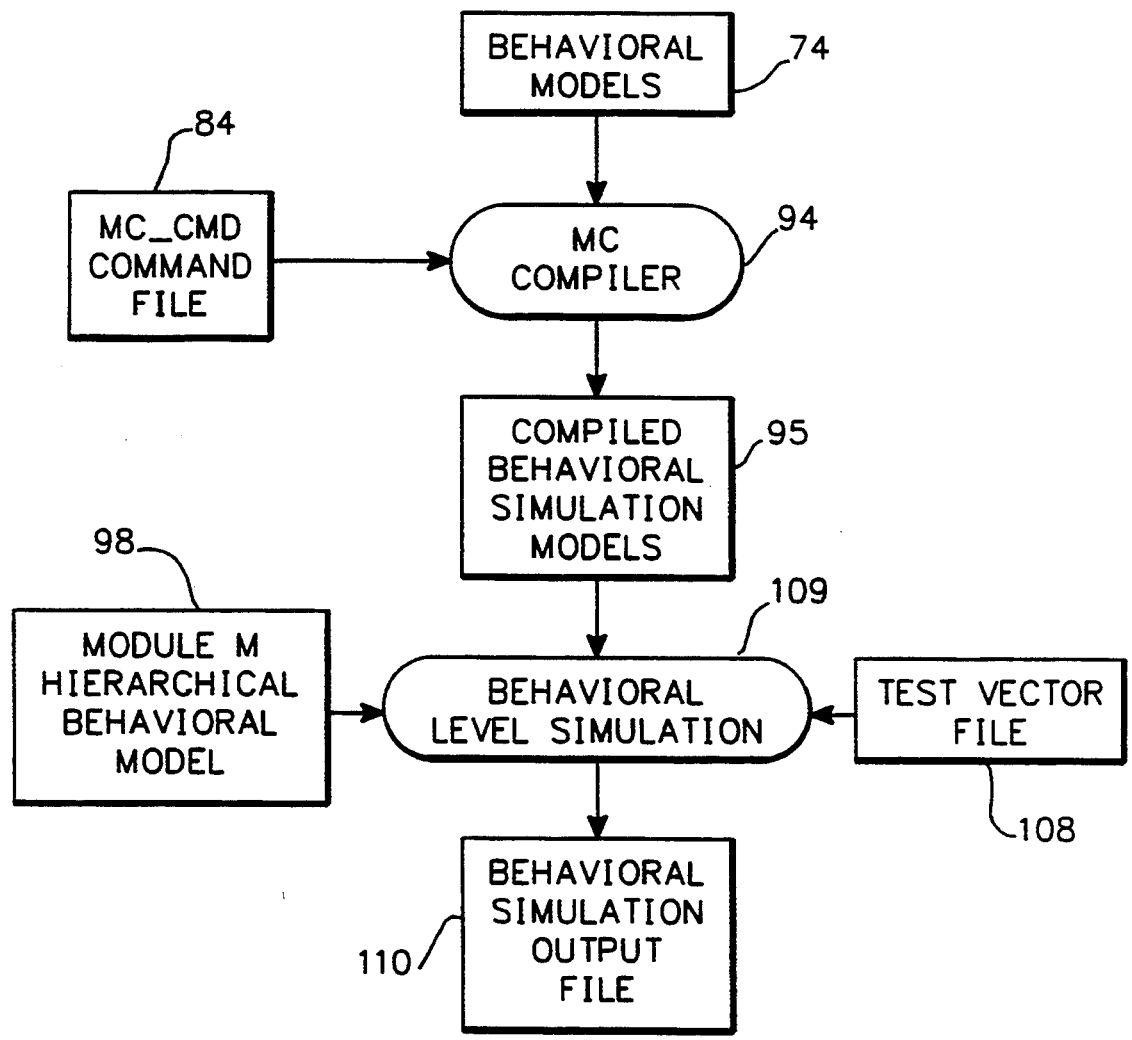
Figure 5:
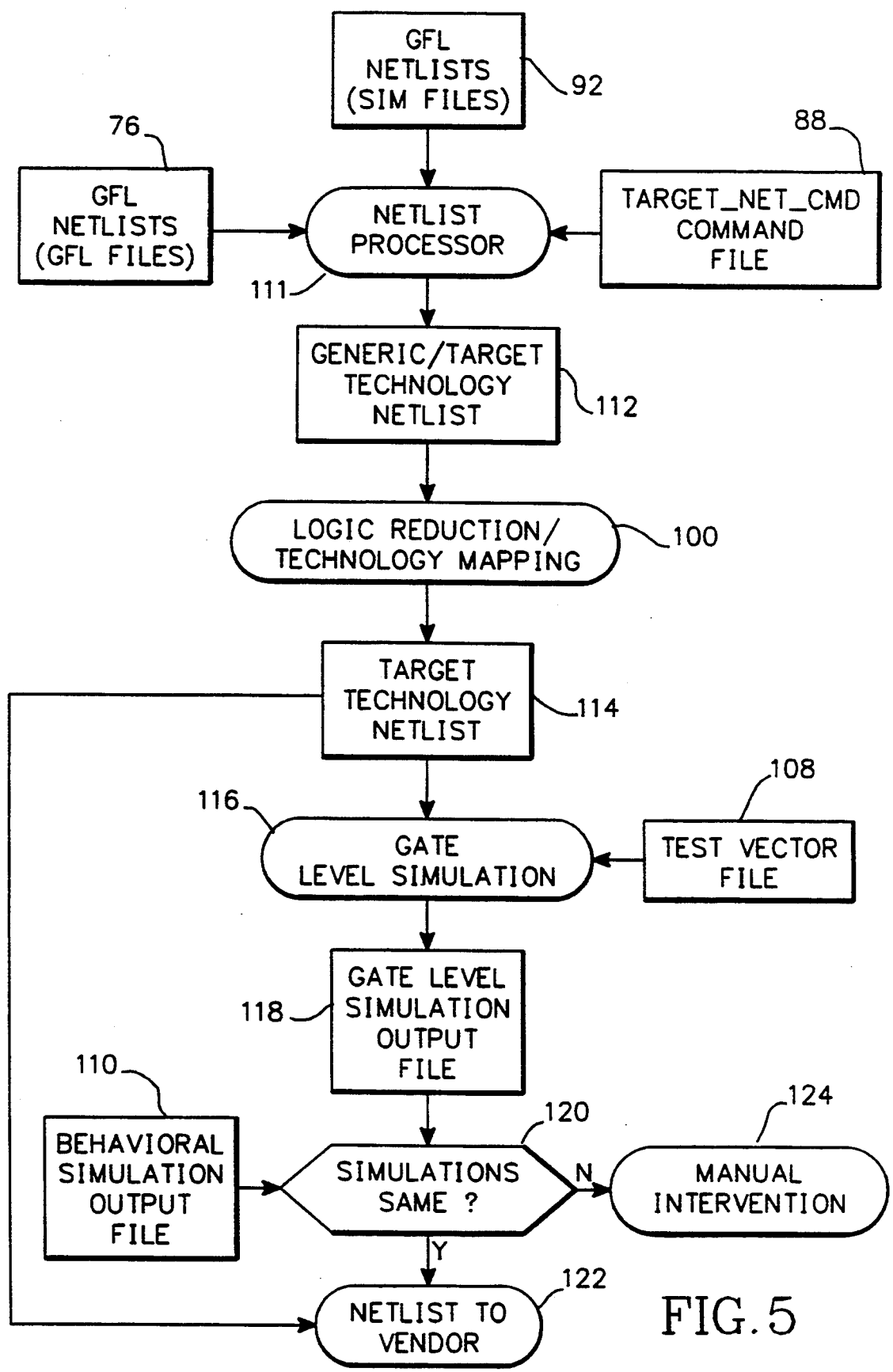

The synthesized netlists are then used as the inputs to the netlist processing 26. The netlist processor merges the individual elements into a single netlist 28 using the same procedure that was mentioned in the discussion of step 16 of the right path 6. The merged netlist 28 is now simulated 30 using the test vectors that were generated from the right path 6. The simulation file is compared 32 with the saved simulation file from the right path. If errors are found, then corrective action requires a return to the synthesis tool and resynthesis of the behavioral models using the appropriate algorithms depending on the type of error discovered. If no errors occur, the comparison verifies that the netlist 28 generated using the target technology library is a functional equivalent of the original design. The netlist 28 is now ready to be transferred to the foundry for circuit routing and fabrication procedures. The test vectors will accompany the netlist to verify working devices after packaging is completed. The details of the general steps in FIG. 1 will be discussed with respect to FIGS. 3–5.

Figure 2:
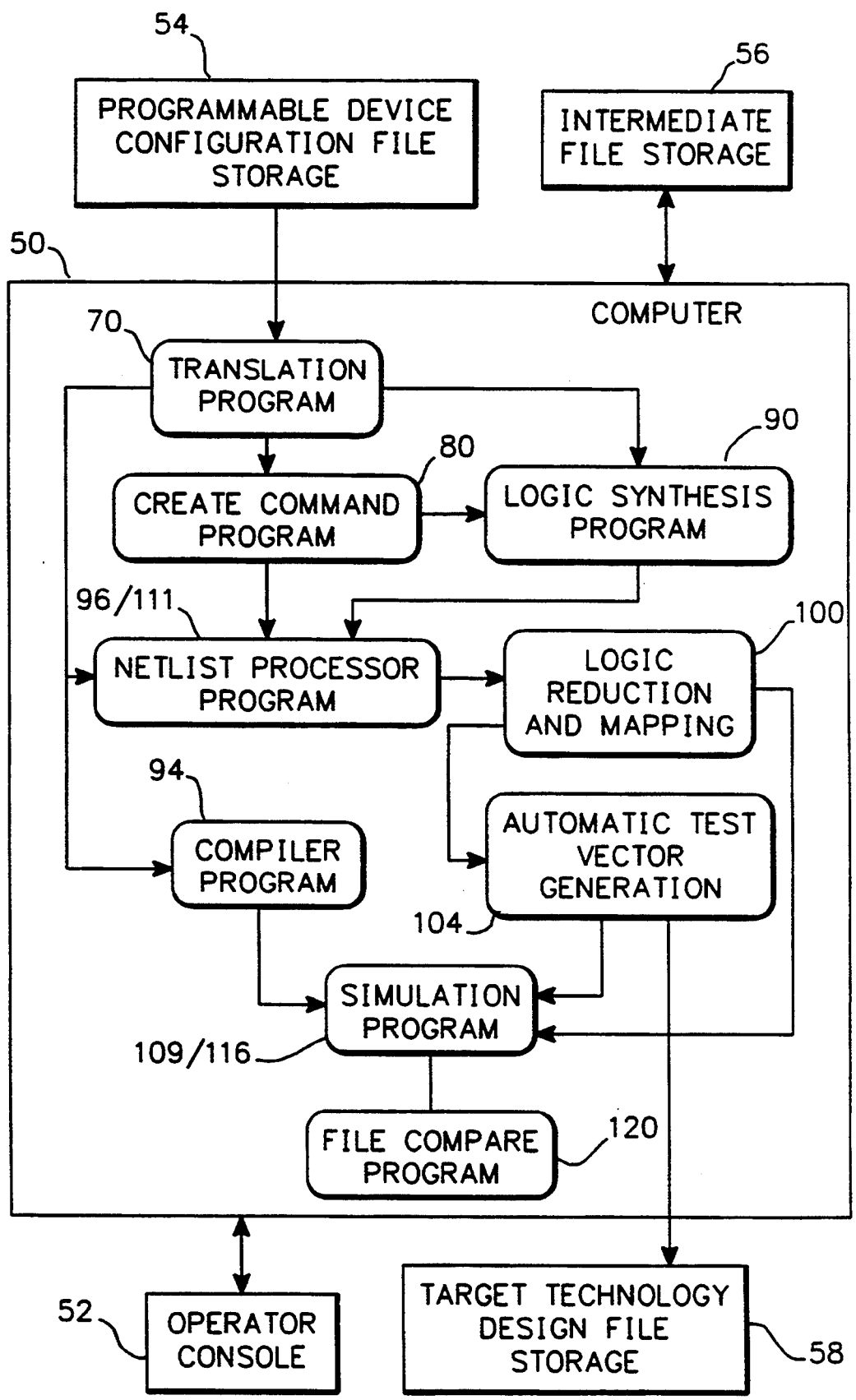
FIG. 2 illustrates the hardware, software programs and files of the present invention.

The present invention is implemented in a general purpose computer 50 including an operator's console 52 and storage devices 54, 56 and 58. The computer, operator's console and storage devices 54, 56 and 58 are preferably an Apollo Workstation computer system available from Hewlett Packard of Rockville, Md. The storage device 54, which could be a floppy disk drive and an associated floppy disk, stores the programmable device configuration file 12 mentioned in FIG. 1. The intermediate files associated with the generic netlist 18 and the target technology netlist 28 are stored in an intermediate storage device 56, such as a hard disk. The verified target technology netlist is preferably stored on a removable storage medium, such as a floppy disk in conjunction with a floppy disk drive, functioning as storage 58. The blocks within computer 50 illustrated in FIG. 2 are various programs which will be discussed with respect to FIGS. 3–5. The block diagram of FIG. 2 shows the flow of program execution indicating which programs must be executed before others of the programs. The execution of each program is initiated from the console by the operator, however, it is of course possible to create a batch control file which would eliminate the need for operator initiation. The embodiment discussed hereafter is designed to convert a Xilinx XC3000 logic cell array family programmable device configuration file into an application specific integration circuit design for a 2.0 micron family device from Lasarray Corporation. Based on the description provided herein and the incorporated appendices, a person of ordinary skill in the art can create conversion processes for converting from other programmable device configuration file formats into other application specific devices.

A Xilinx configuration file consists of a net section and a block section an example of which is provided in Appendix A. The net section lists each internal net of the programmable device and identifies each pin of the blocks connected to the net along with the routing delay from the output pin to each input pin (See the notes on page 1 of Appendix A). The block section lists the configuration of each block used, including information such as which block function feeds the output of the block (combinatorial or registered), and the equations representing the logic functions of the block (See the notes on page 6 of Appendix A).

The translation program 70, the C source code for which is provided in Appendix B, creates a number of files from the configuration file 12 one of which is a generic netlist file 76, an example of which is provided in Appendix C on pages 3 and 4. A behavioral model 74 of each internal Xilinx configurable logic block (CLB) is generated by the translator 70, and includes timing information as well as names of the nets that connect the CLB to other blocks, see Appendix C starting on page 2. All behavioral models 74 are created with and include a filename of the Xilinx block designator with a ".M" extension. The blocks in the Xilinx device which interface with external devices through the chip pins are called Input/Output blocks (IOBs). The automatic nature of the logic synthesis used in this process requires the netlisting of the actual part from the target library into the circuit before logic reduction, optimization, and target technology mapping to insure that the correct "pads" or I/O buffers of the target device are used. A model which represents the target-specific pad circuitry must be generated in order for the pad circuitry to be broken down into generic primitives which can be used in a netlist processing tool (a netlist processor), such as the Netlist Processor from Mentor Graphics of Beaverton, Oreg. The primitives are also used by the Automatic Test Generation (ATG) tool available from Mentor Graphics. This behavioral model is used in the simulator for the initial simulation to which the final converted device simulation is compared. In all cases of conversions to a specific ASIC foundry library, the functions of the original device that represent the I/O buffers (pads) must be separated from the other functions. The multiple behavioral models for IOB's are required, so that the non-I/O functions in the IOB are made independent of the pad circuitry. This is necessary because the I/O buffers use transistors that are much larger than the internal transistors of the ASIC device which allows the chip to drive external capacitive and resistive loads. The buffers only exist at the periphery of the ASIC device and are to be connected to external pins. The Mentor Graphics logic synthesis tool makes no provision for specifying I/O buffers. The only way to ensure insertion of the correct I/O buffer into the netlist is to explicitly call out the model name used in the target technology in a netlist that will be merged with the rest of the circuit.

Each IOB contains two flip-flops between the CLB portion of the device and the output pin that may be used in the IOB configuration. To model an IOB, as many as three behavioral models are created. One model represents the I/O portion, one represents the flip-flop feeding the I/O pin, and one represents the flip-flop feeding the CLB portion of the device. The I/O portion of the pad circuit is also represented in netlist form in an additional file 76 created by the translation program 70. The netlist format is the same as that created by the compilation of the behavioral model for logic synthesis. This enables the substitution of the translation program 70 pad netlist for the compiled netlist when targeting the design to the ASIC foundry's library. While the entire configuration of the IOB could be modeled as a single entity, this would require a change in the translation program netlist for each IOB configuration variation. Using the current concept, a small number of netlists are required, e.g. input, output, tristate, and bidirectional pads. The only change in a netlist of the same type of pad used for different device pins is the naming of the ports that enter and leave the netlist.

The translation program 70 when initiated by an operator, as described, generates behavioral models for CLBs, and both behavioral models and netlists for IOBs. Examples of the behavioral models and netlists are illustrated in Appendix C. Other files 78 generated by the program 70 to be used in subsequent processes include a list of the names of all CLB and IOB flip-flop behavioral model names (clb_list), a list of all IOB pad behavioral models (iob_list), and a list of all signal names which actually enter and leave the device (port_list).

The translation program 70 uses the programmable device configuration file to create both behavioral models and gate function level (GFL) netlists. The delay values for the CLBs and IOBs are defined within the program and are the delays from the inputs to the outputs. This could easily be modified using a delay data file for reading by the program for each programmable device in order to handle varying device speeds. The program reads in a GFL netlist 72 for each type of pad and modifies it for each instance by renaming the external signals of the netlist to match the signal names extracted from the configuration file 12.

The first action taken by the translation program 70 is to set up a data structure for the configurable blocks in the device which includes a field for each input and output of the block, along with the net delay associated with each input. The net portion of the configuration file is read and signal names and delay values are placed into the structure.

Next, the actual block configuration section is read and acted upon. The first line of the block configuration, the config line, defines the programming of the signal paths within the CLB or IOB. This line is parsed by the translation program 70. The block configuration for the CLB is different than for the IOB. The CLB configuration line defines the origin of each of two outputs of the CLB. The origin for each of the outputs may be any of the two combinatorial or the two flip-flop outputs previously mentioned. The configuration line also defines which logic inputs are used as inputs to the combinatorial blocks, and the inputs to the flip-flops. The method in which the configuration is handled is dependent upon the hardware description language (HDL) format which is required by the logic synthesis and simulation compilers. The preferred language is "M", the Mentor Graphics language. The first section in the M Model is the definition of input and output ports. All inputs and outputs of the block are defined in this section. If the CLB flip-flops are used, signals for their outputs are defined as well.

The two compilers used in the process of the present invention, one in the logic synthesis tool which compiles the model into the GFL netlists 92 and the other in the simulator which creates a simulator executable file, require differences in the M model. Sections in the model are different for simulation and synthesis. These sections are blocked off with the use of compiler directives. When each compiler is invoked, it will ignore certain sections of the model.

The format of the configuration line is (See Appendix A):

Config X:_ Y:_ F:_ G:_ DX:_ DY:_ ENCLK:_ RSTDIR:_ CLK:_

The combination logic blocks (CLB), which are described in the information on the Xilinx devices, include outputs which are the X and Y signals. The inputs to the CLB are five logic variables (A–E), a direct input to the flip-flops (DI), a clock enable input to the flip-flops (EC), a reset input to the flip-flops (RSTDIR), and a clock input to the flip-flops (K). The arguments following X: can be either F or QX, and the argument for Y: can be either G or QY. F and G are the outputs of the combinational logic block within the CLB. The arguments for F and G can be any combination of A, B, C, D, E, QX, and QY. DX and DY are the inputs to the flip-flops within the CLB. The arguments for each can be F, G, or DI. The presence of the EC argument after ENCLK indicates that a clock enable is used, and the RD argument after RSTDIR is a rest to the flip-flops. The CLK argument is K. Data sheet delays are available from Xilinx for the CLB internal paths. These delays include the delay from logic inputs to X or Y using F or G as the argument for the output, the delay from the clock to the output using QX or QY as the argument, setup and hold times for logic inputs, direct inputs, and clock enable with respect to the clock, etc.

In behaviorally modeling the CLB for simulation, equations must be used to represent both the logic functions and the propagation delays of the block. The combinatorial logic function equations are taken directly from the configuration file 12 and reformatted into the Mentor Graphics language format. The equations are found in the block section of the configuration file and examples are shown on page 6 of Appendix A. The simulation model requires ports to be defined for each node which is an input or output of any equation in the model. To account for net delays read from the net section of the configuration file, delay buffers are modeled for each input.

After the translation program 70 is executed, another program 80, create_cmd, is run by the operator. A copy of the C source code for this program is provided in Appendix D. This program 80 reads the clb_list and iob_list files and generates command files to be used in the Mentor Graphics netlist processor (Np). The files created are Msyn_cmd82, Mc_cmd84, gen_net_cmd86, and target_net_cmd88. Msyn_cmd82 contains commands which invoke a logic synthesis compiler 90, available from Mentor Graphics on all behavioral models to create a netlist 92 for each. Mc_cmd84 contains a list of commands to invoke a simulation compiler 94, also from Mentor Graphics, on all behavioral models to create simulation ".0" files 95 to be used in behavioral level simulation. The gen_net_cmd file 86 contains commands which are used by the netlist processor 96. These commands utilize custom functions written for NP and which reside in a command function file, Np_func, and an example of the custom functions is provided in Appendix E. The functions in Np_func are used to read in the merged netlist into Np, to delete all ports in the merged netlist that do not appear in the port_list file 78 supplied by the translation program 70, and to create a hierarchical functional simulation model 98 for use in the behavioral simulation 109.

The output of Np (the netlist processor) when the gen_net_cmd file 86 is used as the command file is a generic netlist consisting of Autologic primitives. This netlist is read into the Autologic program available from Mentor Graphics and logic reduction 100 is run on the netlist by the Autologic program. The output is a reduced netlist 102 which is fed into a Mentor Graphics ATG tool 104 for automatic test vector generation. The test vectors 106 used to test the original programmable device can also be input to the tool 104 as seed vectors to ensure a complete test vector set. The resulting test vectors are stored in a file 108 for use in a simulator, Lsim, available from Mentor Graphics.

The simulation 109 is invoked on the hierarchical model 98 created by the netlist processor 91 using the gen_net_cmd file 86. The model is simulated using the test vectors 108 created during ATG 104 and the output results are stored in a behavioral simulation output file 110.

The netlist processor from Mentor Graphics is again run 111 using the target_net_cmd file 88. This reads in Gate Function Level (GFL) netlists 76 substituting the netlists created by the translation program 70 for the netlists 92 created for the pads during synthesis. The output of the netlist processor using the target_net_cmd 88 as the command file is a netlist 112 that is a mixture of Autologic primitives and target library specific parts. This netlist 112 is read into the Autologic program, mapped 100 to all target components, and optimized. The output is a reduced netlist 114 in the Lsim netlist format using parts that correspond to the ".0" simulation models previously generated in Autologic during installation of the foundry library into the Autologic database which can be easily accomplished by a person of ordinary skill in the art. The target technology netlist 114 is simulated 116 using Lsim at the gate level with the test vector 108 file previously created to produce a gate level simulation file 118.

The output 118 of the second simulation 116 is compared 120 to the output 110 of the first simulation 109 to determine the correctness of the conversion by using a conventional file content compare utility, such as the Unix file compare utility. If correct (that is, if the output files match) the netlist 114 is sent 122 to the gate array vendor and if not manual correction is performed.

The many features and advantages of the invention are apparent from the detailed specification and thus it is intended by the appended claims to cover all such features and advantages of the invention which fall within the true spirit and scope of the invention. Further, since numerous modifications and changes will readily occur to those skilled in the art, it is not desired to limit the invention to the exact construction and operation illustrated and described, and accordingly all suitable modifications and equivalents may be resorted to, falling within the scope of the invention.

What is claimed is:

1. A method of logic device specification from a programmable device specification for a programmable device, comprising the steps of:
   (a) producing a hierarchical behavioral model from the programmable device specification;
   (b) producing a generic device design from the programmable device specification;
   (c) simulating operation of the generic device design responsive to the hierarchical behavioral model;
   (d) producing a specific device design from the programmable device specification;
   (e) simulating operation of the specific device design; and
   (f) comparing the simulations of steps (c) and (e) and indicating the specific device design is correct when the simulations match.

2. A method as recited in claim 1, further comprising producing test vectors for the generic device design and using the test vectors in the simulations of steps (c) and (d).

3. A method as recited in claim 1, wherein step (d) includes performing logic reduction.

4. A method as recited in claim 1, wherein step (b) comprises creating a complete set of hierarchical behavioral models for the programmable device and step (c) comprises simulating the hierarchical behavioral models.

5. A method as recited in claim 4, wherein step (b) creates behavioral models of input/output blocks.

6. A method as recited in claim 1, wherein the programmable device specification is a programmable device configuration file.

7. A method of logic device specification from a programmable device specification for a programmable device, comprising the steps of:
   (a) simulating the programmable device using a complete hierarchical behavioral model of the device;
   (b) simulating the programmable device as a target technology device; and
   (c) verifying the target technology device when the simulations match.

8. A method of specifying an application specific integrated circuit logic device in a target technology from a programmable device configuration file for a programmable device, comprising the steps of:
   (a) translating the programmable device configuration file into a behavioral model having delays and timings of the programmable device, and device lists;
   (b) creating netlist processing, logic synthesis, target and compiler commands from the device lists;
   (c) performing logic synthesis from the behavioral model responsive to the logic synthesis commands;
   (d) processing the synthesized logic to produce a hierarchical behavioral model and a generic network list responsive to the netlist processing commands;
   (e) reducing the generic network list;
   (f) generating a test vector from the reduced generic network list;
   (h) compiling the behavioral model;
   (i) simulating operation of the behavioral model using the compiled behavioral model, the hierarchical behavioral model and the test vector;
   (j) producing a generic/target technology network list responsive to the target commands;
   (k) mapping the generic/target technology network list to a target technology network list and optimizing the target technology network list;
   (l) simulating operation of the target technology network list;
   (m) comparing the behavioral model simulation with the target technology network list simulation; and
   (n) manufacturing the integrated circuit logic device from the target technology network list when the behavioral model simulation matches the target technology network list simulation.

9. An apparatus for converting a programmable logic device design into an application specific logic device design, comprising:
   means for producing and performing a simulation of a hierarchical behavioral device design from the programmable logic device design;
   means for producing and performing a simulation of the application specific logic device design from the programmable logic device design; and
   means for comparing the simulations and verifying the application specific logic device design when the simulations match.

* * * * *